United States Patent
Cheng et al.

(10) Patent No.: US 10,515,958 B2
(45) Date of Patent: Dec. 24, 2019

(54) FINFETS AND METHODS OF FORMING FINFETS

(71) Applicant: Taiwan Semiconductor Manufacturing Company, Ltd., Hsinchu (TW)

(72) Inventors: Tung-Wen Cheng, New Taipei (TW); Chih-Shan Chen, New Taipei (TW); Wei-Yang Lo, Kaohsiung (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 16/051,332

(22) Filed: Jul. 31, 2018

(65) Prior Publication Data

US 2018/0350809 A1    Dec. 6, 2018

Related U.S. Application Data

(62) Division of application No. 15/200,770, filed on Jul. 1, 2016, now Pat. No. 10,163,898.

(Continued)

(51) Int. Cl.
| | |
|---|---|
| *H01L 27/088* | (2006.01) |
| *H01L 21/306* | (2006.01) |
| *H01L 21/8234* | (2006.01) |
| *H01L 29/06* | (2006.01) |
| *H01L 29/08* | (2006.01) |

(Continued)

(52) U.S. Cl.
CPC .... *H01L 27/0886* (2013.01); *H01L 21/30604* (2013.01); *H01L 21/823431* (2013.01); *H01L 29/0649* (2013.01); *H01L 29/0847* (2013.01); *H01L 29/1054* (2013.01); *H01L 29/167* (2013.01); *H01L 29/66795* (2013.01); *H01L 29/7848* (2013.01)

(58) Field of Classification Search
None
See application file for complete search history.

(56) References Cited

U.S. PATENT DOCUMENTS

| 7,667,271 B2 | 2/2010 | Yu et al. |
| 8,362,575 B2 | 1/2013 | Kwok et al. |

(Continued)

FOREIGN PATENT DOCUMENTS

| CN | 103579176 A | 2/2014 |
| CN | 103681347 A | 3/2014 |

(Continued)

*Primary Examiner* — Khaja Ahmad
(74) *Attorney, Agent, or Firm* — Slater Matsil, LLP

(57) ABSTRACT

An embodiment is a structure including a first fin over a substrate, a second fin over the substrate, the second fin being adjacent the first fin, an isolation region surrounding the first fin and the second fin, a first portion of the isolation region being between the first fin and the second fin, a gate structure along sidewalls and over upper surfaces of the first fin and the second fin, the gate structure defining channel regions in the first fin and the second fin, a gate seal spacer on sidewalls of the gate structure, a first portion of the gate seal spacer being on the first portion of the isolation region between the first fin and the second fin, and a source/drain region on the first fin and the second fin adjacent the gate structure.

20 Claims, 22 Drawing Sheets

Related U.S. Application Data

(60) Provisional application No. 62/327,135, filed on Apr. 25, 2016.

(51) Int. Cl.
*H01L 29/10* (2006.01)
*H01L 29/167* (2006.01)
*H01L 29/66* (2006.01)
*H01L 29/78* (2006.01)

(56) References Cited

U.S. PATENT DOCUMENTS

| | | | |
|---|---|---|---|
| 8,367,498 B2 | 2/2013 | Chang et al. | |
| 8,440,517 B2 | 5/2013 | Lin et al. | |
| 8,497,528 B2 | 7/2013 | Lee et al. | |
| 8,610,240 B2 | 12/2013 | Lee et al. | |
| 8,680,576 B2 | 3/2014 | Ching et al. | |
| 8,723,272 B2 | 5/2014 | Liu et al. | |
| 8,729,627 B2 | 5/2014 | Cheng et al. | |
| 8,729,634 B2 | 5/2014 | Shen et al. | |
| 8,785,285 B2 | 7/2014 | Tsai et al. | |
| 8,796,759 B2 | 8/2014 | Perng et al. | |
| 8,809,139 B2 | 8/2014 | Huang et al. | |
| 8,828,823 B2 | 9/2014 | Liu et al. | |
| 8,836,016 B2 | 9/2014 | Wu et al. | |
| 8,841,701 B2 | 9/2014 | Lin et al. | |
| 8,847,281 B2 | 9/2014 | Cea et al. | |
| 8,847,293 B2 | 9/2014 | Lee et al. | |
| 8,853,025 B2 | 10/2014 | Zhang et al. | |
| 9,136,383 B2 | 9/2015 | Wann et al. | |
| 9,450,094 B1 * | 9/2016 | Yeh | H01L 29/7848 |
| 9,455,314 B1 * | 9/2016 | Cheng | H01L 29/0638 |
| 2011/0068407 A1 | 3/2011 | Yeh et al. | |
| 2013/0011983 A1 | 1/2013 | Tsai et al. | |
| 2014/0042500 A1 | 2/2014 | Wann et al. | |
| 2014/0065782 A1 | 3/2014 | Lu et al. | |
| 2014/0203338 A1 | 7/2014 | Kelly et al. | |
| 2014/0252412 A1 | 9/2014 | Tsai et al. | |
| 2014/0308808 A1 | 10/2014 | Cheng et al. | |
| 2015/0108544 A1 | 4/2015 | Ching et al. | |
| 2015/0179645 A1 * | 6/2015 | Liao | H01L 29/41791 257/77 |
| 2015/0255576 A1 | 9/2015 | Liao et al. | |
| 2015/0263172 A1 | 9/2015 | Cho et al. | |
| 2015/0372140 A1 | 12/2015 | Liu et al. | |
| 2015/0380305 A1 | 12/2015 | Basker et al. | |
| 2016/0027918 A1 | 1/2016 | Kim et al. | |
| 2016/0049467 A1 * | 2/2016 | Wu | H01L 29/66795 257/401 |
| 2016/0254383 A1 | 9/2016 | Wann et al. | |
| 2016/0293749 A1 * | 10/2016 | Park | H01L 29/66545 |
| 2016/0315081 A1 | 10/2016 | Park et al. | |

FOREIGN PATENT DOCUMENTS

| | | |
|---|---|---|
| KR | 20140029094 A | 3/2014 |
| KR | 20150044804 A | 4/2015 |
| KR | 20160011742 A | 2/2016 |
| TW | 201407786 A | 2/2014 |
| TW | 201409707 A | 3/2014 |

* cited by examiner

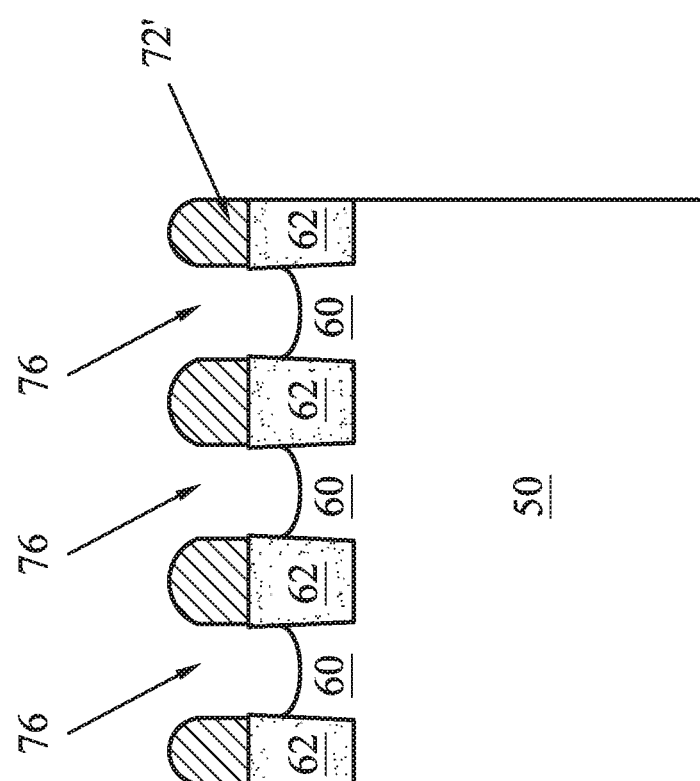

FINFETS AND METHODS OF FORMING FINFETS

PRIORITY CLAIM AND CROSS-REFERENCE

This application is a divisional of U.S. patent application Ser. No. 15/200,770, filed on Jul. 1, 2016 and entitled "FINFETS AND METHODS OF FORMING FINFETS," which claims priority of U.S. Provisional Application No. 62/327,135, filed on Apr. 25, 2016 and entitled "FINFETS AND METHODS OF FORMING FINFETS," which patent applications are incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over (e.g., wrapping) the fin. Having a gate on both sides of the channel allows gate control of the channel from both sides. However, there are challenges to implementation of such features and processes in semiconductor fabrication.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 6, 7A-7C, 8A-8C, 9A-9C, and 10 through 14 are three-dimensional and cross-sectional views of intermediate stages in the manufacturing of FinFETs in accordance with some embodiments.

DETAILED DESCRIPTION

Figure 1:
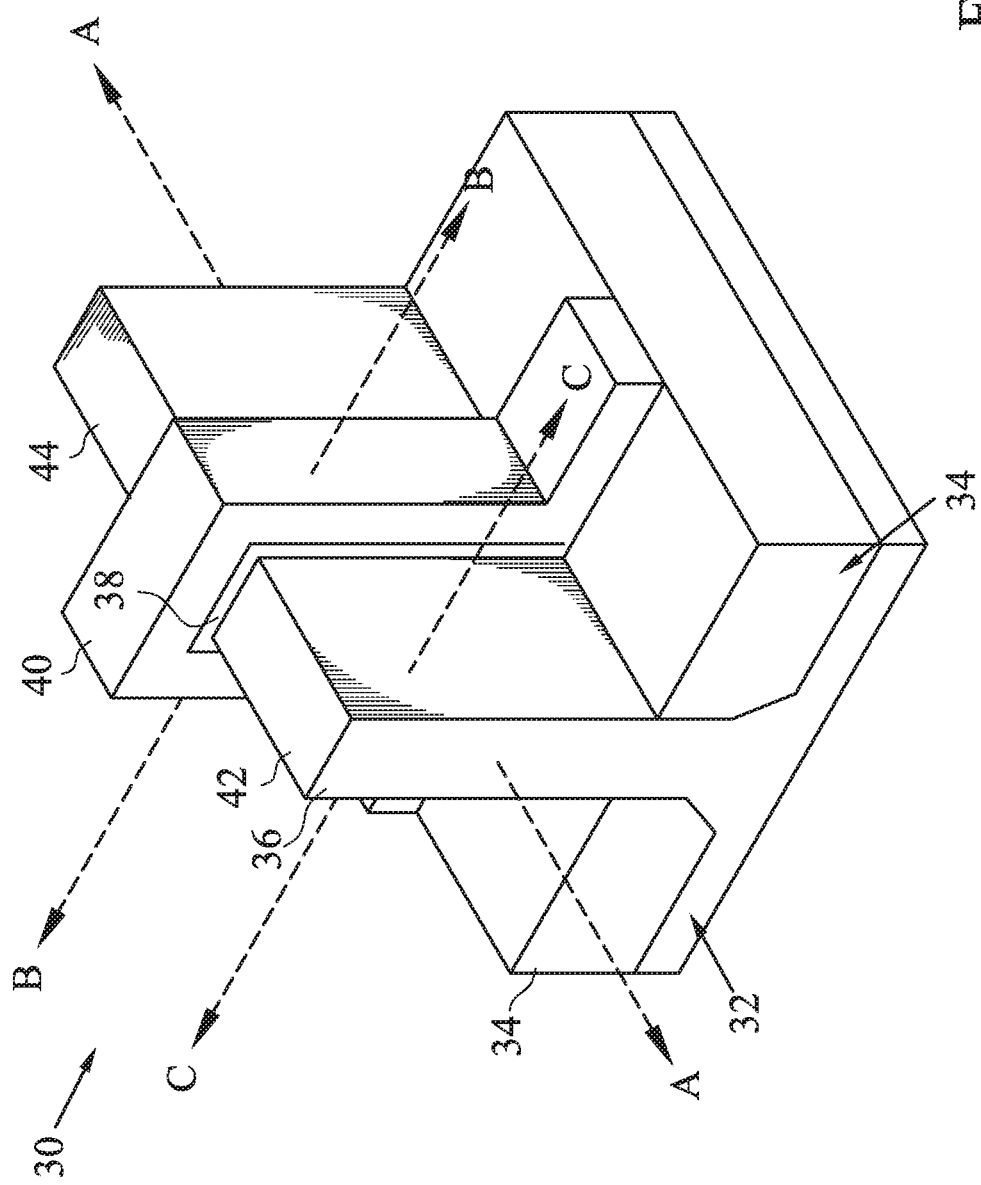
FIG. 1 is an example of a Fin Field-Effect Transistor (FinFET) in a three-dimensional view.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and methods of forming the same are provided in accordance with various embodiments. Intermediate stages of forming FinFETs are illustrated. Some embodiments discussed herein are discussed in the context of FinFETs formed using a gate-first process. In other embodiments, a gate-last process (sometimes referred to as replacement gate process) may be used. Some variations of the embodiments are discussed. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

Before addressing the illustrated embodiments specifically, certain advantageous features and aspects of the present disclosed embodiments will be addressed generally. In general terms, the present disclosure is a semiconductor device and method of forming the same to provide a simple and cost-effective process flow to achieve a epitaxial source/drain in a FinFET with less defects (such as dislocations), at least near a channel region of the FinFET, for device enhancement. In addition, this simple and cost-effective process flow may achieve better isolation between adjacent fins by reducing the leakage between adjacent fins and may also reduce the contact resistance to the source/drain region. In particular, embodiments such as those disclosed below include a process flow and structure that utilizes epitaxially grown source/drain regions with some of the isolation material of the isolation region (e.g. shallow trench isolation (STI) region) and some of the sidewall spacer material remaining between the adjacent fins in the source/drain regions. This remaining isolation material and spacer material suppresses the generation of dislocations because it reduces the amount of epitaxial volume between adjacent fins. Further, the remaining isolation material and spacer material can reduce the capacitance between the between the epitaxial source/drain structure. This reduced capacitance can allow for better alternating current (AC) performance for the device. Further, an upper surface of the epitaxial source/drain structure may have a non-planar (e.g. undulating and/or wavy) top surface, which can increase the contact surface area for the overlying contact. This increased contact surface area can reduce the contact resistance to the source/drain region.

FIG. 1 illustrates an example of a FinFET 30 in a three-dimensional view. The FinFET 30 includes a fin 36 on a substrate 32. The substrate 32 includes isolation regions 34, and the fin 36 protrudes above and from between neighboring isolation regions 34. A gate dielectric 38 is along sidewalls and over a top surface of the fin 36, and a gate electrode 40 is over the gate dielectric 38. Source/drain regions 42 and 44 are disposed in opposite sides of the fin 36 with respect to the gate dielectric 38 and gate electrode

40. FIG. 1 further illustrates reference cross-sections that are used in later figures. Cross-section B-B is across a channel, gate dielectric 38, and gate electrode 40 of the FinFET 30. Cross-section C-C is parallel to cross-section B-B and is across a source/drain region 42. Cross-section A-A is perpendicular to cross-section B-B and is along a longitudinal axis of the fin 36 and in a direction of, for example, a current flow between the source/drain regions 42 and 44. Subsequent figures refer to these reference cross-sections for clarity.

FIGS. 2 through 6, 7A-7C, 8A-8C, 9A-9C, and 10 through 14 are three dimensional and cross-sectional views of intermediate stages in the manufacturing of FinFETs in accordance with some embodiments. FIGS. 2 through 6, 7A-7C, 8A-8C, 9A-9C, and 10 through 16 illustrate a FinFET similar to FinFET 30 in FIG. 1, except for multiple fins. FIGS. 2 through 6 illustrate cross-section B-B. In FIGS. 7A through 9C, figures ending with an "A" designation are three-dimensional views, figures ending with a "B" designation illustrate cross-section B-B, and figures ending with a "C" designation illustrate cross-section C-C. FIGS. 10 and 12-14 illustrate cross-section C-C and FIG. 11 illustrates cross-section A-A.

Figure 2:

FIG. 2 illustrates a substrate 50. Substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 may include integrated circuit devices (not shown). As one of ordinary skill in the art will recognize, a wide variety of integrated circuit devices such as transistors, diodes, capacitors, resistors, the like, or combinations thereof may be formed in and/or on the substrate 50 to generate the structural and functional requirements of the design for the FinFET. The integrated circuit devices may be formed using any suitable methods.

Figure 3:
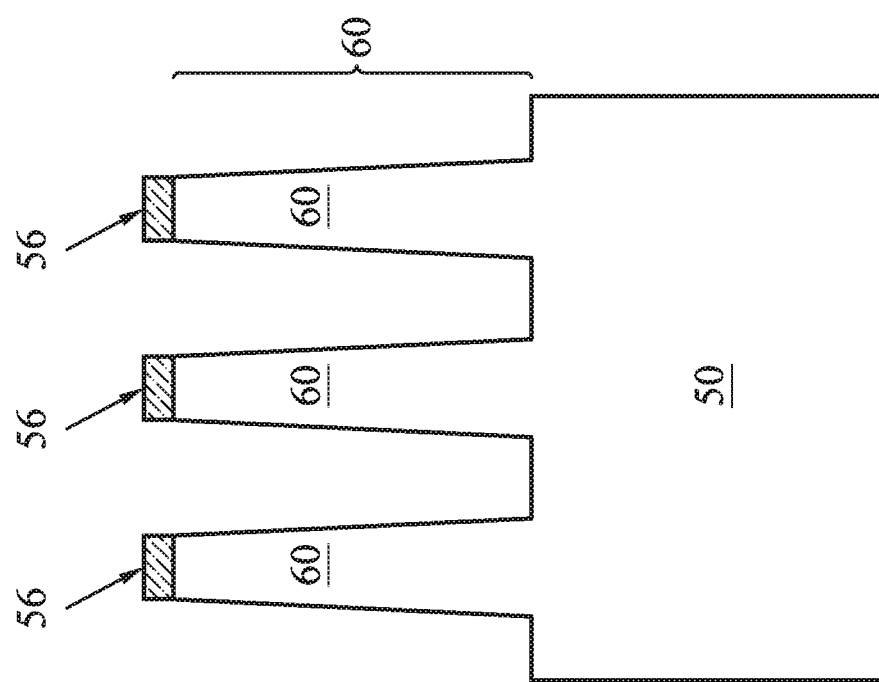

FIG. 3 illustrates the formation and patterning of a mask layer 56 over the substrate 50 and the patterning of the substrate 50 using the mask layer 52 to form semiconductor strips 60. In some embodiments, the mask layer 52 is a hard mask and may be referred to as hard mask 52 hereinafter. The hard mask 52 may be formed of silicon nitride, silicon oxynitride, silicon carbide, silicon carbonitride, the like, or a combination thereof.

In some embodiments, the semiconductor strips 60 may be formed by etching trenches in the substrate 50. The etching may be any acceptable etch process, such as a reactive ion etch (RIE), neutral beam etch (NBE), the like, or a combination thereof. The etch may be anisotropic.

Figure 4:
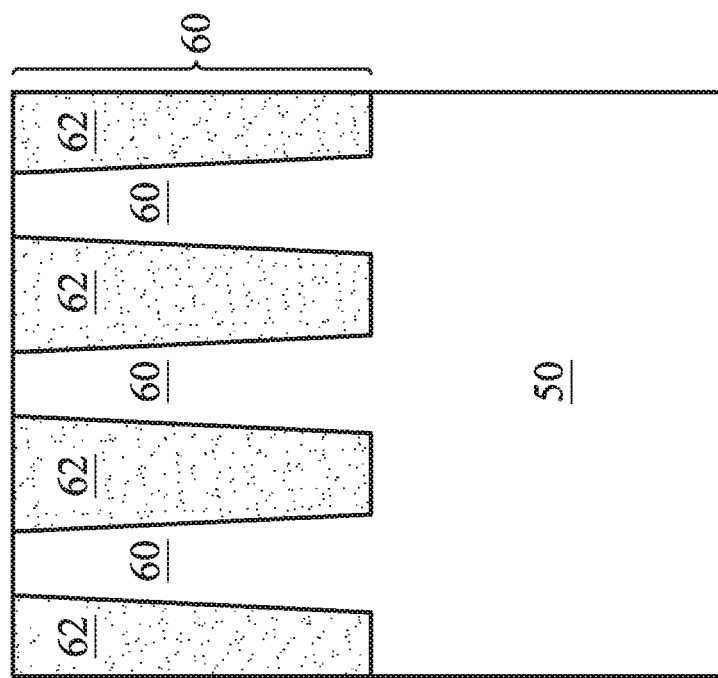

FIG. 4 illustrates the formation of an insulation material between neighboring semiconductor strips 60 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. Further in FIG. 4, a planarization process, such as a chemical mechanical polish (CMP), may remove any excess insulation material (and, if present, the hard mask 56) and form top surfaces of the isolation regions 62 and top surfaces of the semiconductor strips 60 that are coplanar.

Figure 5:
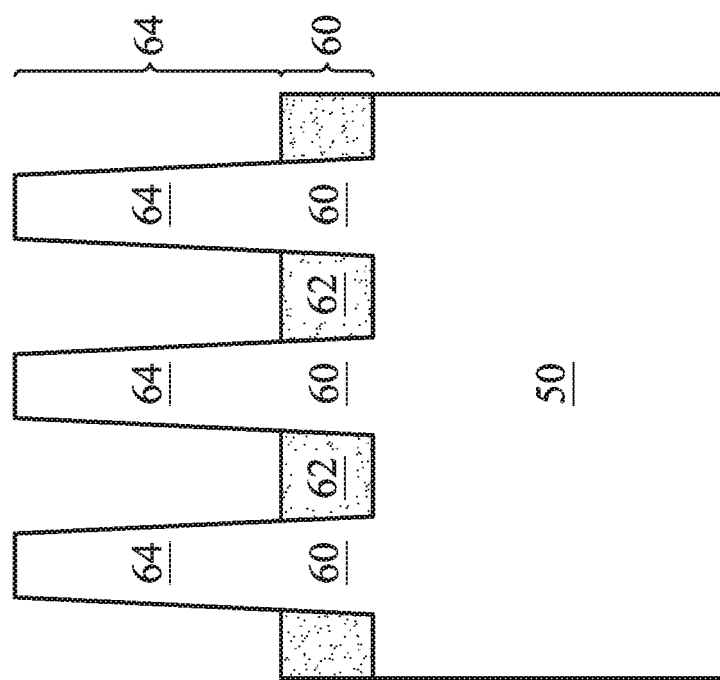

FIG. 5 illustrates the recessing of the isolation regions 62, such as to form shallow trench isolation (STI) regions 62. The isolation regions 62 are recessed such that the upper portions of the semiconductor strips 60 protrude from between neighboring isolation regions 62 and form semiconductor fins 64. The top surfaces of the isolation regions 62 may have a flat surface as illustrated, a convex surface, a concave surface (such as dishing), or a combination thereof. The top surfaces of the isolation regions 62 may be formed flat, convex, and/or concave by an appropriate etch. The isolation regions 62 may be recessed using an acceptable etching process, such as one that is selective to the material of the isolation regions 62. For example, a chemical oxide removal using a CERTAS® etch or an Applied Materials SICONI tool or dilute hydrofluoric (dHF) acid may be used.

FIGS. 2 through 5 illustrate an embodiment of forming fins 64, but fins may be formed in various different processes. In one example, the fins can be formed by etching trenches in a substrate to form semiconductor strips; the trenches can be filled with a dielectric layer; and the dielectric layer can be recessed such that the semiconductor strips protrude from the dielectric layer to form fins. In another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins. In still another example, heteroepitaxial structures can be used for the fins. For example, the semiconductor strips can be recessed, and a material different from the semiconductor strips may be epitaxially grown in their place. In an even further example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins may comprise silicon germanium ($Si_xGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 6:
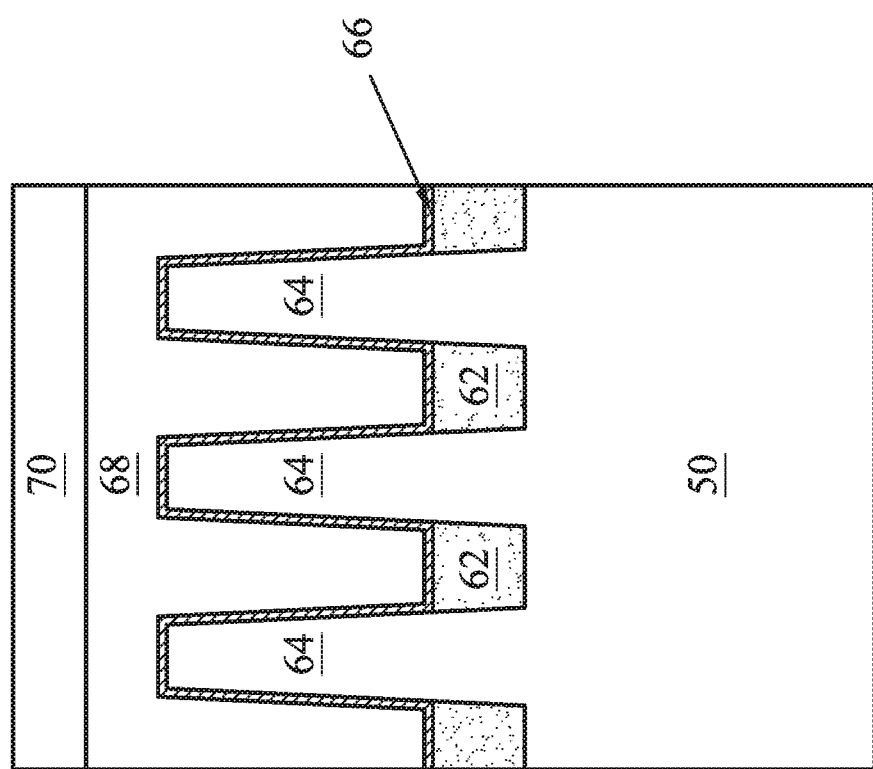

FIG. 6 illustrates the formation of a gate structure over the semiconductor fins 64. A dielectric layer (not shown) is formed on the semiconductor fins 64 and the isolation regions 62. The dielectric layer may be, for example, silicon oxide, silicon nitride, multilayers thereof, or the like, and may be deposited or thermally grown according to acceptable techniques. In some embodiments, the dielectric layer may be a high-k dielectric material, and in these embodiments, dielectric layer may have a k value greater than about 7.0, and may include a metal oxide or a silicate of Hf, Al, Zr, La, Mg, Ba, Ti, Pb, multilayers thereof, and combinations thereof. The formation methods of dielectric layer may include molecular-beam deposition (MBD), atomic layer deposition (ALD), plasma-enhanced CVD (PECVD), and the like.

A gate layer (not shown) is formed over the dielectric layer, and a mask layer (not shown) is formed over the gate layer. The gate layer may be deposited over the dielectric layer and then planarized, such as by a CMP. The mask layer may be deposited over the gate layer. The gate layer may be formed of, for example, polysilicon, although other materials may also be used. In some embodiments, the gate layer may include a metal-containing material such as TiN, TaN, TaC, Co, Ru, Al, combinations thereof, or multi-layers thereof. The mask layer may be formed of, for example, silicon nitride or the like.

After the layers are formed, the mask layer may be patterned using acceptable photolithography and etching techniques to form mask 70. The pattern of the mask 70 then may be transferred to the gate layer and dielectric layer by an acceptable etching technique to form gate 68 and gate dielectric 66. The gate 68 and the gate dielectric 66 cover respective channel regions of the semiconductor fins 64. The gate 68 may also have a lengthwise direction substantially perpendicular to the lengthwise direction of respective semiconductor fins 64.

Figure 7A:
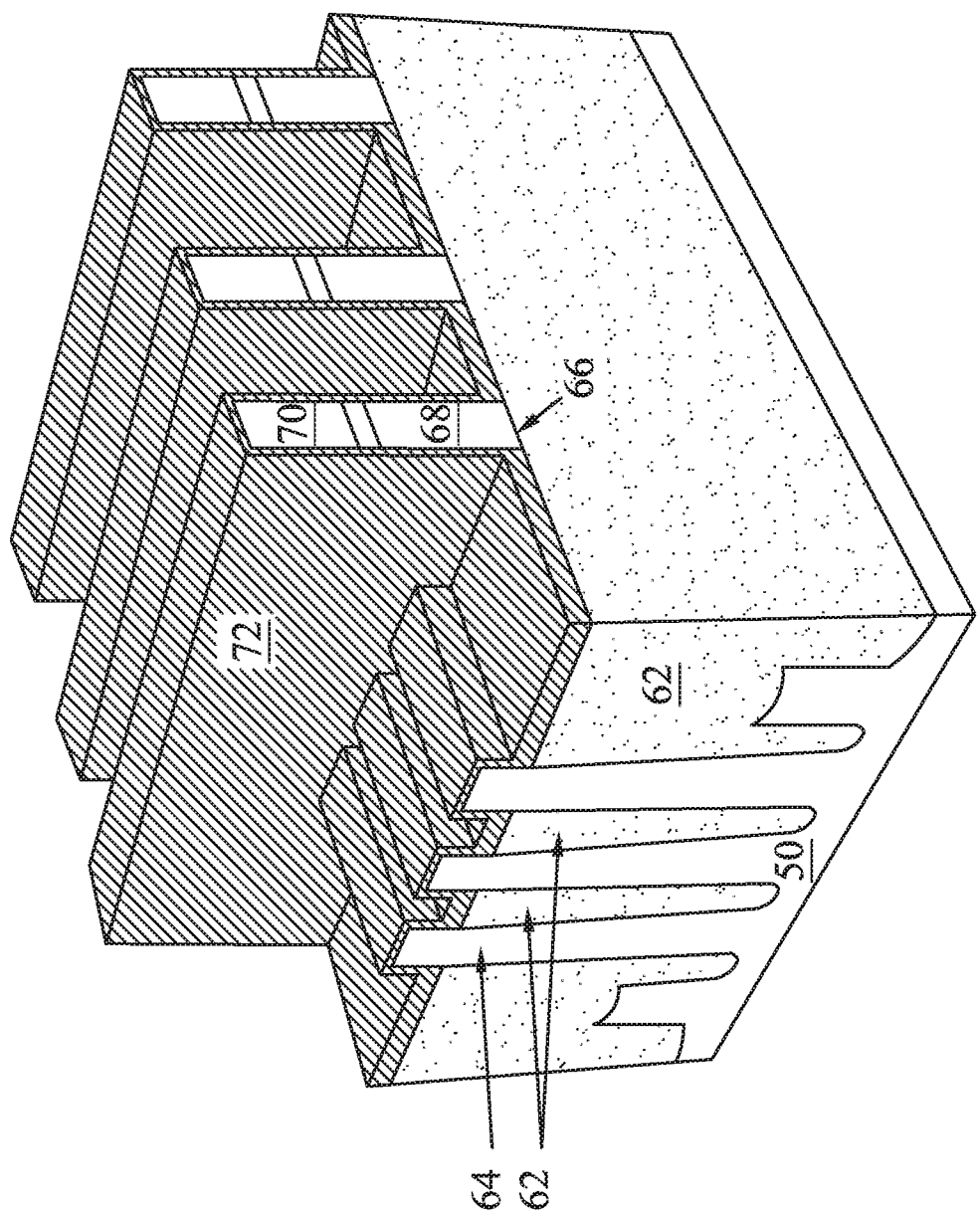
Figure 7B:
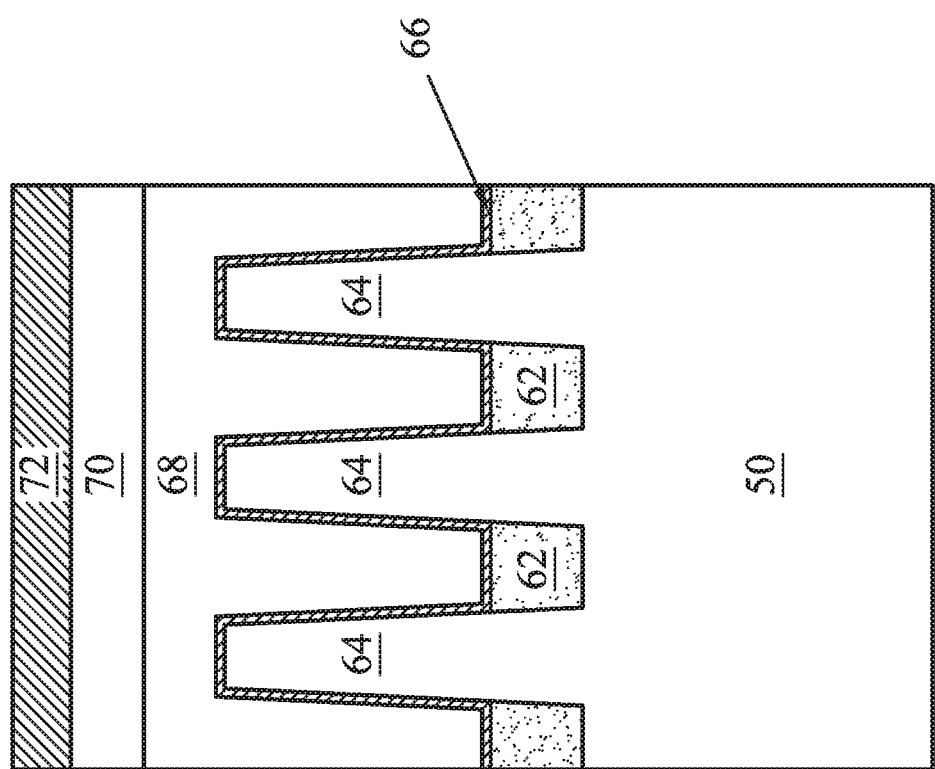
Figure 7C:
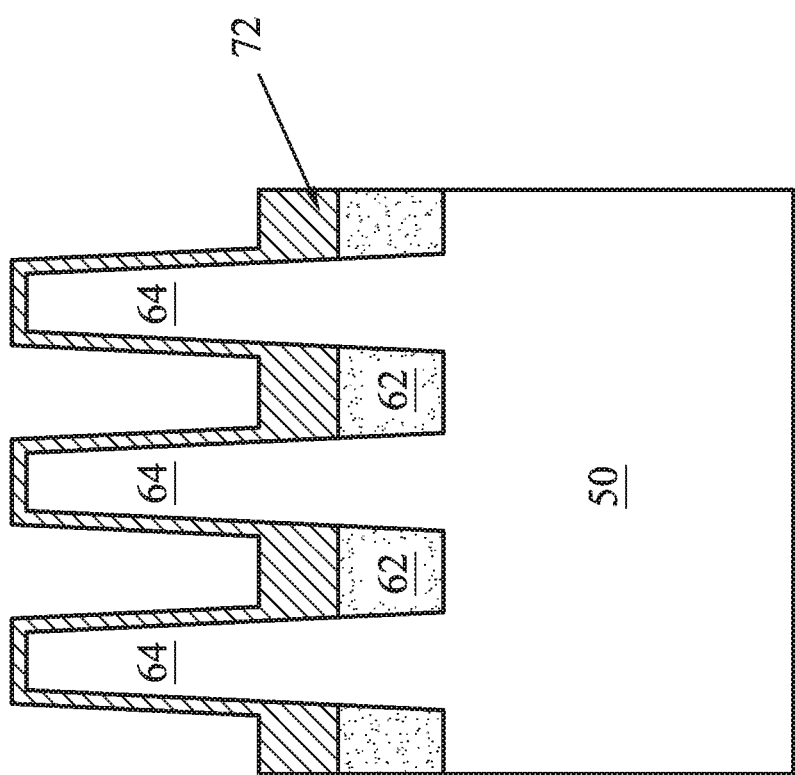

FIGS. 7A, 7B, and 7C illustrate the formation of gate seal spacers 72 on exposed surfaces of isolation regions 62, semiconductor fins 64, gate 68, and mask 70. A thermal oxidation or a deposition process may form the gate seal spacers 72. In some embodiments, the gate seal spacers 72 may be formed of a nitride, such as silicon nitride, silicon oxynitride, silicon carbide, silicon carbonitride, the like, or a combination thereof.

Figure 8A:
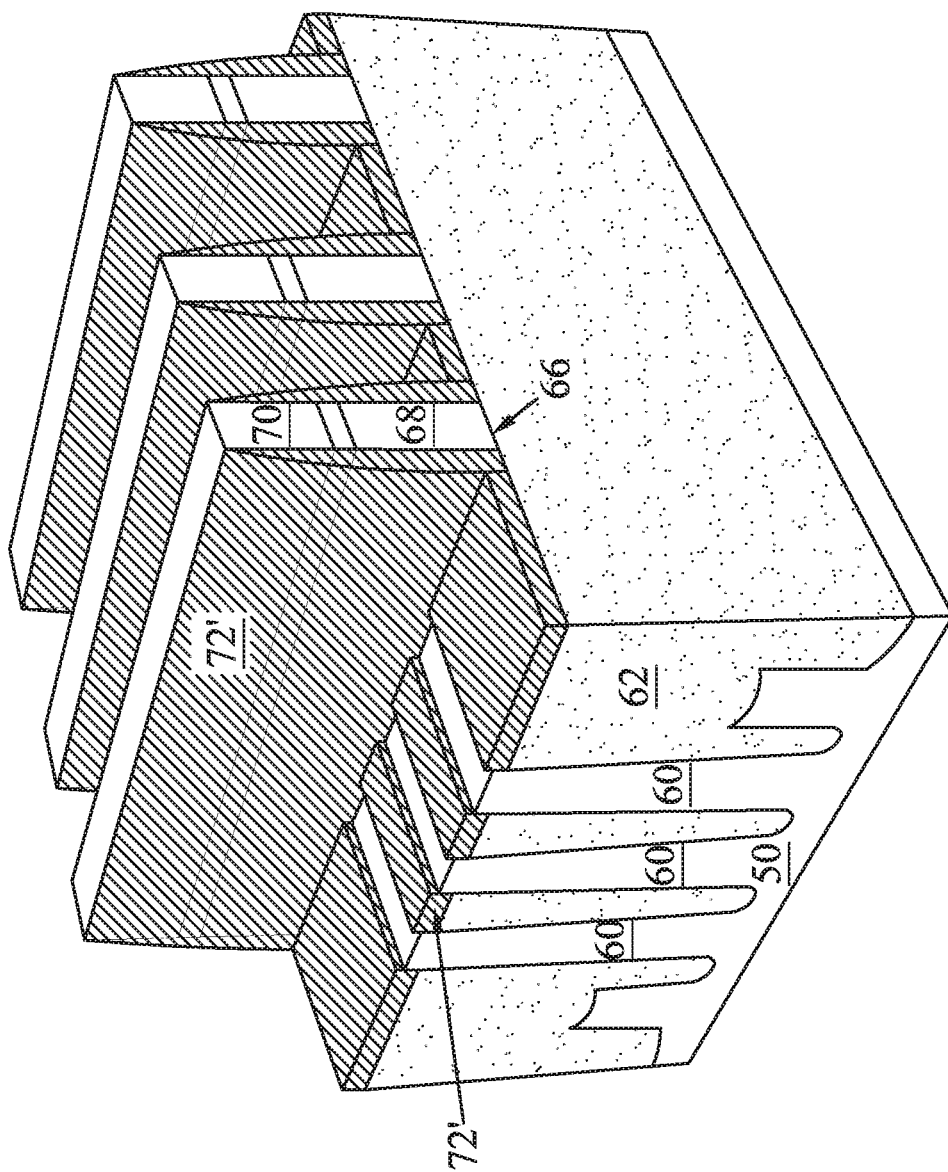
Figure 8B:
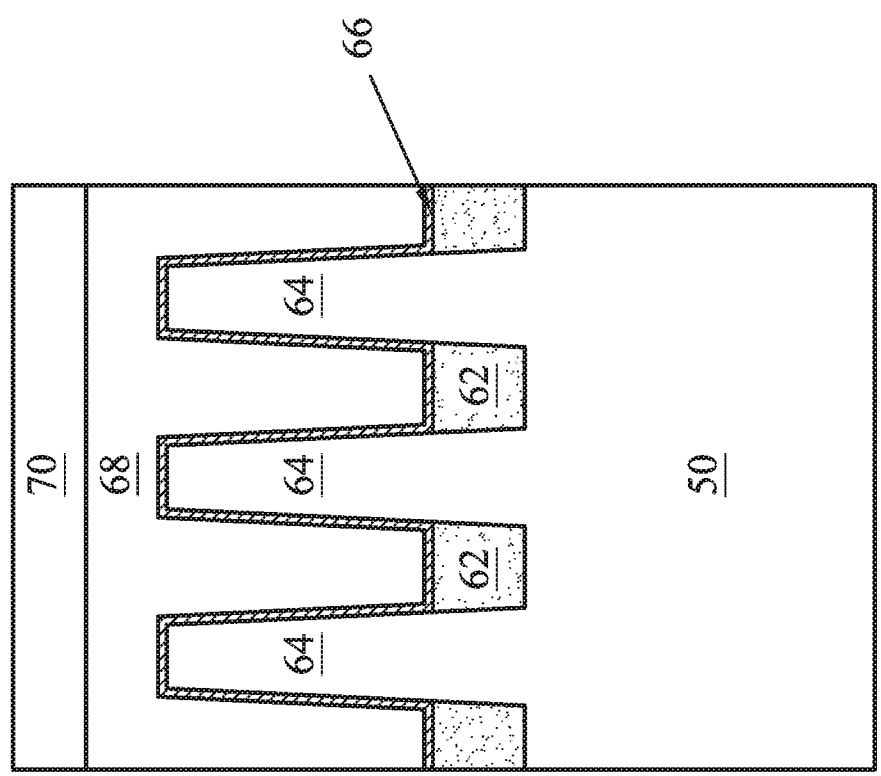
Figure 8C:
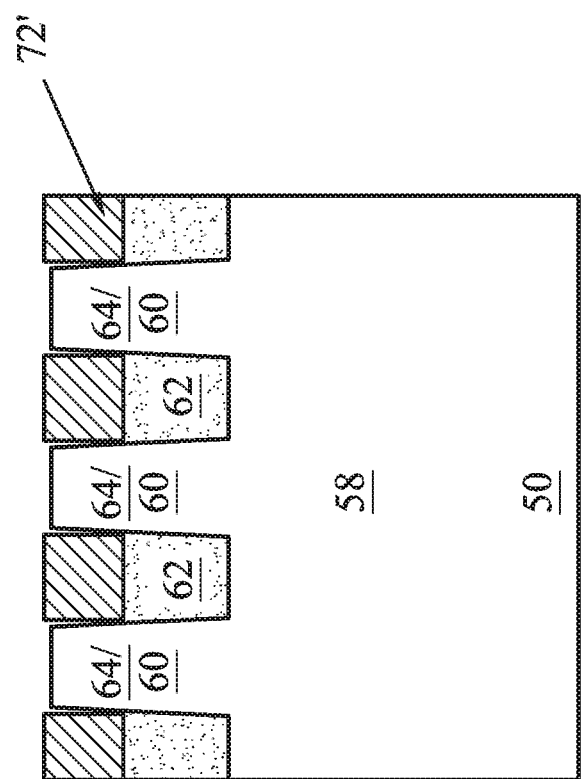

FIGS. 8A, 8B, and 8C illustrate removing portions of the gate seal spacers outside of the sidewalls of the gate structures. In some embodiments, an anisotropic etch process, such as a dry etch process, may be used to remove portions of the gate seal spacers 72 outside of the sidewalls of the gate structures. In some embodiments, after the etch process, some portions of the gate seal spacers 72 remains on the isolation regions 62 between the adjacent semiconductor fins 64 (see FIGS. 8C, 9C, 10, and 12-14). The reason that some gate seal spacer material 72 remains on the isolation regions 62 may be at least at least partially due to the gate seal spacer material 72 being formed thicker on the isolation regions 62 as compared to the top surface of the semiconductor fins 64 (see FIG. 7C).

Further in FIGS. 8A, 8B, 8C, and FIGS. 9A, 9B, and 9C the fins 64 outside of the gate structures are removed. The gate structures may be used as a mask during the removal of the fins 64. In some embodiments, the removal of the fins 64 outside of the gate structure is a multiple step removal process. In an embodiment, the multiple step removal process includes a first dry etch process and a second wet etch process. As illustrated in FIGS. 8A, 8B, and 8C, the first dry etch process removes upper portions of the fins 64 outside of the gate structure while maintaining gate seal spacer material 72' on the isolation regions between adjacent fins 64. The second wet etch process selectively etches the remaining portions of the fins 64 and, in some embodiments, etches into the semiconductor strips 60 below an upper surface of the isolation regions 62 to form recesses 76 in the semiconductor fins 64 and/or isolation regions 62.

The first step dry etch process may be any acceptable etch process, such as a RIE, NBE, the like, or a combination thereof. In an embodiment, the first step dry etch process is a plasma dry etch process with a lower bombardment such that the gate seal spacer material 72' is preserved on the isolation regions 62 between the adjacent semiconductor fins. The etch may be anisotropic. In some embodiments, the first step dry etch process has a bias voltage of less than or equal to about 50 volts in an environment with a pressure greater than or equal to about 100 millitorr (mTorr). The plasma may be generated by any suitable method of generating the plasma, such as transformer coupled plasma generator, inductively coupled plasma systems, magnetically enhanced reactive ion etching, electron cyclotron resonance, a remote plasma generator, or the like.

Figure 9A:
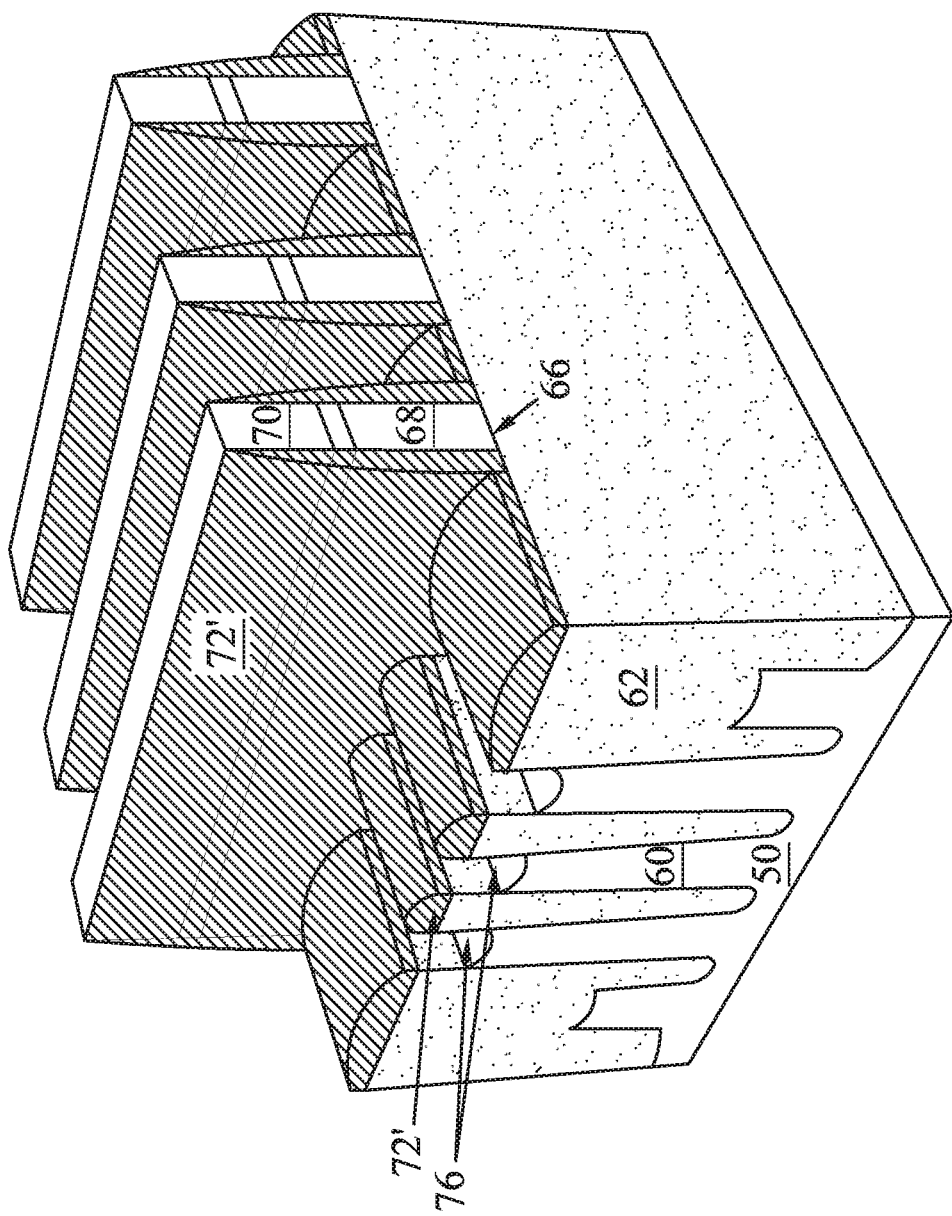
Figure 9B:
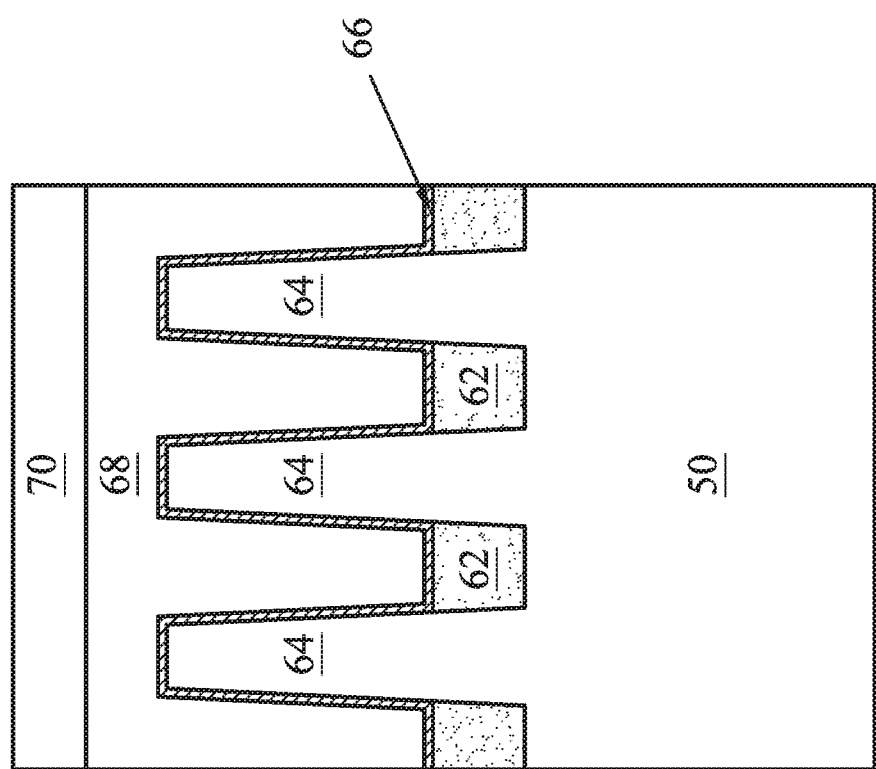

As illustrated in FIGS. 9A, 9B, and 9C, after the first dry etch process, the second wet etch process further removes the fins 64/60 between the remaining isolation regions 62 and the remaining gate seal spacer material 72' to form recesses 76. In some embodiments, the recesses 76 have surfaces extending below top surfaces of the isolation regions 62. This second wet etch process may be any acceptable etch process, such as tetramethyalammonium hydroxide (TMAH), ammonium hydroxide (NH$_4$OH), a wet etchant capable of etching the fins 64/60 with good etch selectivity between the material of the fins 64/60 and a material of the isolation regions 62 and the gate seal spacer material 72. The etch may be isotropic. In some embodiments, after both the dry and wet etch processes have been performed, the remaining gate seal spacer material 72' may have rounded top surfaces (see FIG. 9C) due to the etching processes. In some embodiments, the top surfaces of the semiconductor strips 60 are exposed as at least portions of the bottom surfaces of the recesses 76.

Figure 10:
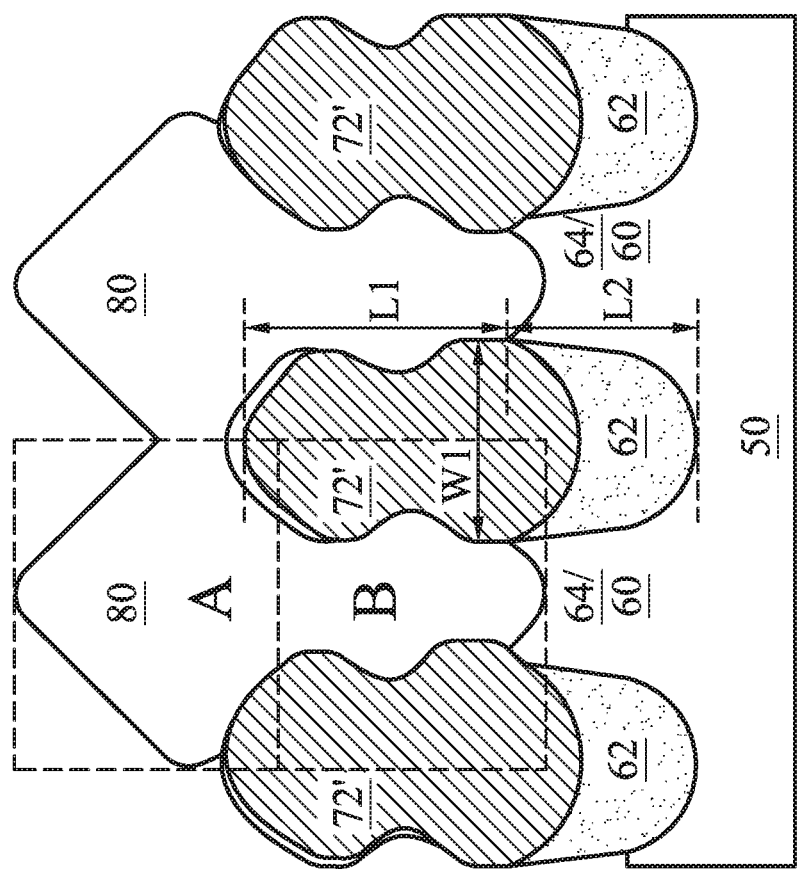
Figure 11:
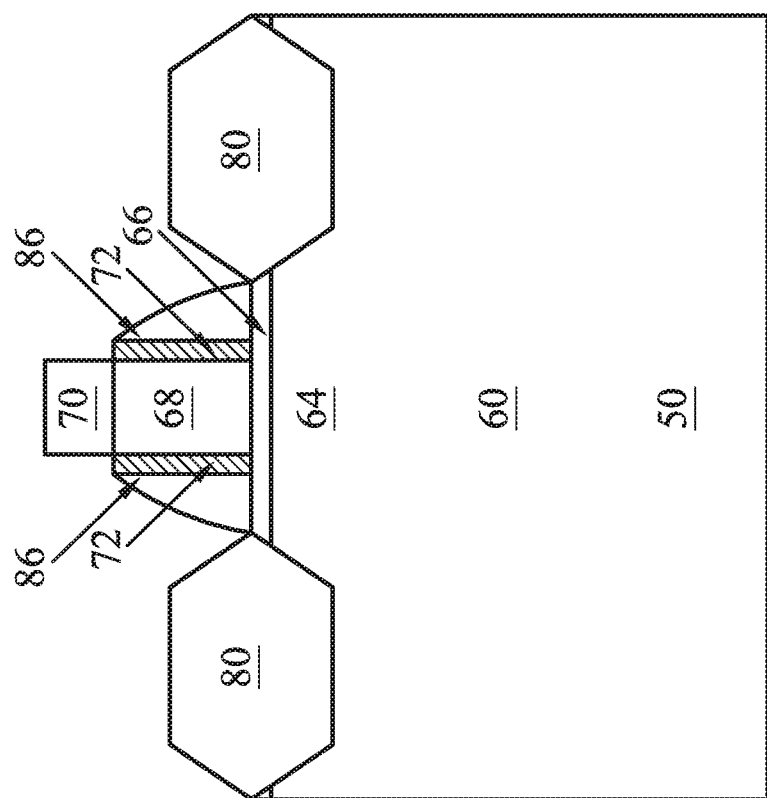

FIG. 10 illustrates the formation of the source/drain regions 80. The source/drain regions 80 are formed in the recesses 76 by epitaxially growing a material in the recesses, such as by metal-organic CVD (MOCVD), molecular beam epitaxy (MBE), liquid phase epitaxy (LPE), vapor phase epitaxy (VPE), selective epitaxial growth (SEG), the like, or a combination thereof. As illustrated in 10, due to the blocking of the remaining isolation region material 62 and remaining gate seal spacer material 72' between the adjacent fins 64/60, source/drain regions 80 are first grown vertically in the recesses 76 (section B in FIG. 10), during which time the source/drain regions 80 do not grow horizontally. After recesses 76 are fully filled, the source/drain regions 80 are grown both vertically and horizontally to form facets (section A in FIG. 10). As illustrated in FIG. 10, the remaining gate seal spacer material 72' may have round top surfaces and non-planar sidewalls (i.e. wavy or undulating sidewalls) due to the etching steps and/or force from the growth of the epitaxial source/drain regions 80.

In FIG. 10, a Bi-layer like epitaxial source/drain structure 80 with sections A and B is illustrated. The structure between epitaxial structures (sometimes referred to as an Inter-Epitaxial structure), includes both the remaining isolation region material 62 and remaining gate seal spacer material 72' and may also be referred to as an Inter-Epi Bi-Layer structure. In some embodiments, the remaining gate seal spacer material 72' extends between and contacts both the A sections of the source/drain region 80 on the adjacent fins 64/60. The Inter-Epi Bi-Layer structure includes a first layer (L1) of gate seal spacer material 72' over a second layer (L2) of isolation region material 62. In some embodiments, L1 has a height in a range from about 9 nm to about 15 nm. The height of L1 will help to control the epitaxial volume of the source/drains 80 and this will directly impact the WAT performance of the device. In some embodiments, L2 has a height in a range from about 14 nm to about 20 nm. The height of L2 will help to determine the electrical isolation between adjacent fins and also will help to control the epitaxial volume of the source/drains 80. In some embodiments, the width (W1) of the Inter-Epi Bi-Layer structure is in a range from about 17 nm to about 23 nm. The larger the width W1 of the Inter-Epi Bi-Layer structure, the more pressure the Inter-Epi Bi-Layer structure applies to the epitaxial volume of the source/drains 80 which can degrade the WAT performance, particularly it can degrade the (Isat/Ion) performance.

As illustrated in FIG. 10, the source/drain regions 80 of the adjacent fins 64/60 merge to form a continuous epitaxial source/drain region 80. In some embodiments, the source/drain regions 80 for adjacent fins 64/60 do not merge together and remain separate source/drain regions 80. In some exemplary embodiments in which the resulting FinFET is an n-type FinFET, source/drain regions 80 comprise silicon carbide (SiC), silicon phosphorous (SiP), phosphorous-doped silicon carbon (SiCP), or the like. In alternative exemplary embodiments in which the resulting FinFET is a p-type FinFET, source/drain regions 80 comprise SiGe, and a p-type impurity such as boron or indium.

The epitaxial source/drain regions 80 may be implanted with dopants to form source/drain regions 80 followed by an anneal. The implanting process may include forming and patterning masks such as a photoresist to cover the regions of the FinFET that are to be protected from the implanting process. The source/drain regions 80 may have an impurity concentration in a range from about $10^{19}$ cm$^{-3}$ to about $10^{21}$ cm$^{-3}$. In some embodiments, the epitaxial source/drain regions may be in situ doped during growth.

FIG. 11 illustrates the intermediate stage of processing of FIG. 10 along the cross-section A-A of FIG. 1. As illustrated in FIG. 11, the epitaxial source/drain regions 80 may have surfaces raised from respective surfaces of the fins 64 (e.g. raised above the non-recessed portions of the fins 64) and may have facets. FIG. 11 further illustrates gate spacers 86 on the gate seal spacers 72 along sidewalls of the gate structure. The gate spacers 86 may be formed by conformally depositing a material and subsequently anisotropically etching the material. The material of the gate spacers 86 may be silicon nitride, SiCN, a combination thereof, or the like. The gate spacers 86 may be formed before or after the epitaxial source/drain regions 80. In some embodiments, dummy gate spacers are formed on the gate seal spacers 72 before the epitaxial process of the epitaxial source/drain regions 80 and the dummy gate spacers are removed and replaced with the gate spacers 86 after the epitaxial source/drain regions 80 are formed.

Figure 12:
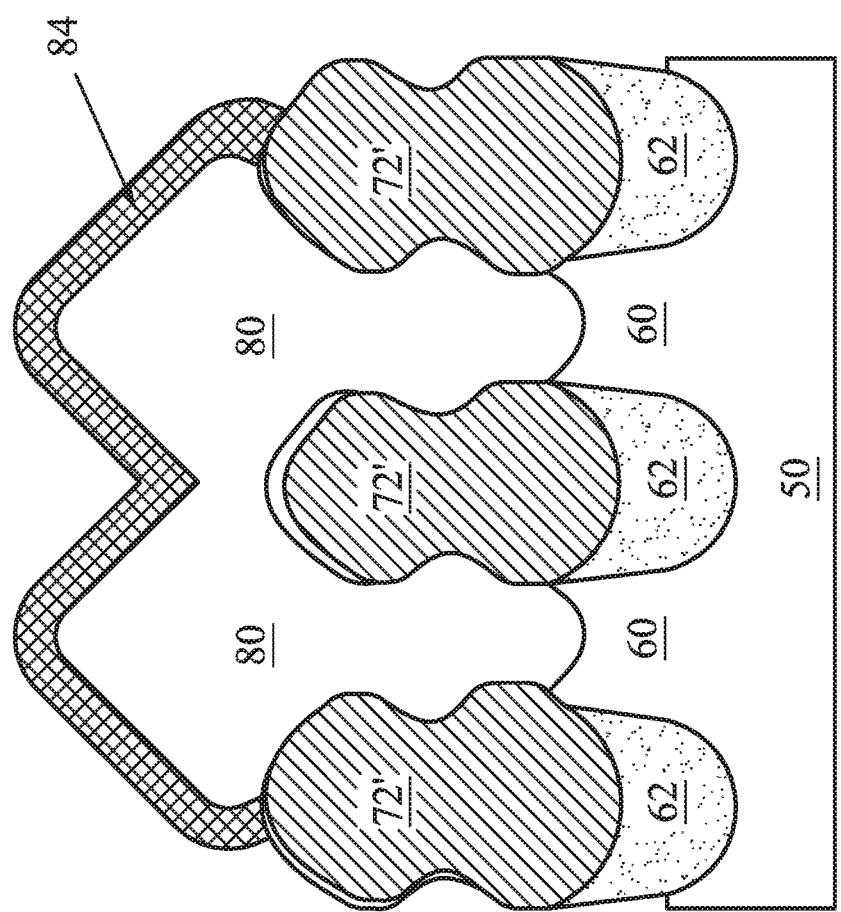

After the formation of the source/drain regions 80, a capping layer 84 is formed on the source/drain regions 80. The capping layer 84 may be considered part of the source/drain regions. In some embodiments, the capping layer 84 is epitaxially grown on the source/drain regions 80. The capping layer 84 helps to protect the source/drain regions 80 from dopant loss during the subsequent processing (e.g. etching processes, temperature processing, etc.). The topography of the source/drain regions 80 may be controlled to be non-planar, as shown in FIGS. 10 and 12, or planar (not shown).

The source/drain regions 80 can have a Ge concentration of greater than 40%. The higher concentration of the source/drain regions 80 allows for the source/drain regions 80 to apply greater stress to the channel region of the FinFET. This high dopant concentration portion of the source/drain regions 80 may be referred to a stressor layer 80. In addition, the dopant concentration of the capping layer 84 and the stressor layer 80 can be different. For example, the capping layer 84 can have a Ge concentration of less about 40% while the stressor layer 80 has a Ge concentration of greater than 40%.

In some embodiments, the stressor layer 80 and the capping layer 84 can be formed in a single, continuous epitaxial process. In other embodiments, these structures may be formed in separate processes. In the embodiment with the single, continuous process, the processing parameters of the epitaxial process (e.g. process gas flow, temperature, pressure, etc.) can be varied to form these structures with the varying material compositions. For example, during the epitaxy, the flow rate of the germanium-containing precursor (such as GeH$_4$) may be at a first level during the initial formation of the stressor layer 80 (sometimes referred to as a buffer layer) and may be increased to a second level when transitioning to the formation of the main part of the stressor layer 80. Further, the flow rate of the germanium-containing precursor may be decreased to a third level from the second level when transitioning to the formation of the capping layer 84. The capping layer 84 and the buffer layer may be considered part of the source/drain regions.

Subsequent processing of the FinFET device may be performed, such as the formation of one or more interlayer dielectrics and formation of contacts. These processes will be discussed below in reference to FIGS. 13 and 14.

Figure 13:
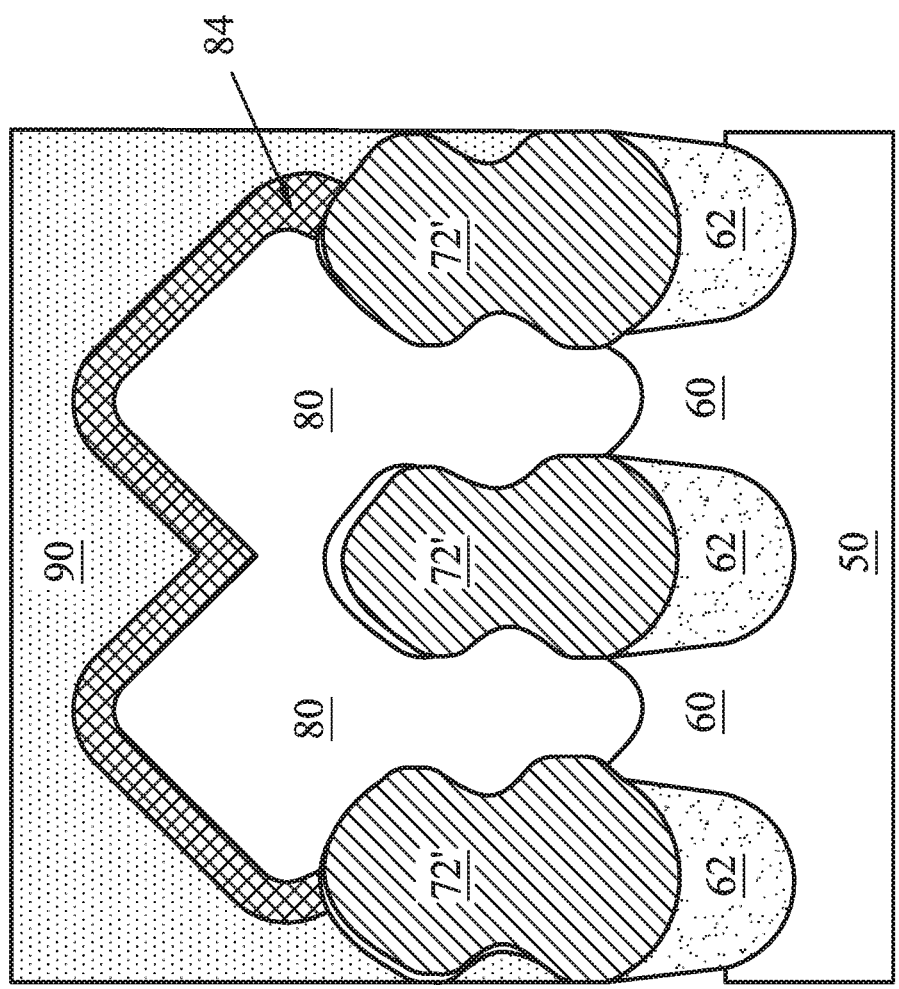

In FIG. 13, an interlayer dielectric (ILD) 90 is deposited over the structure illustrated in FIG. 12. The ILD 90 is formed of a dielectric material such as phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD.

Figure 14:
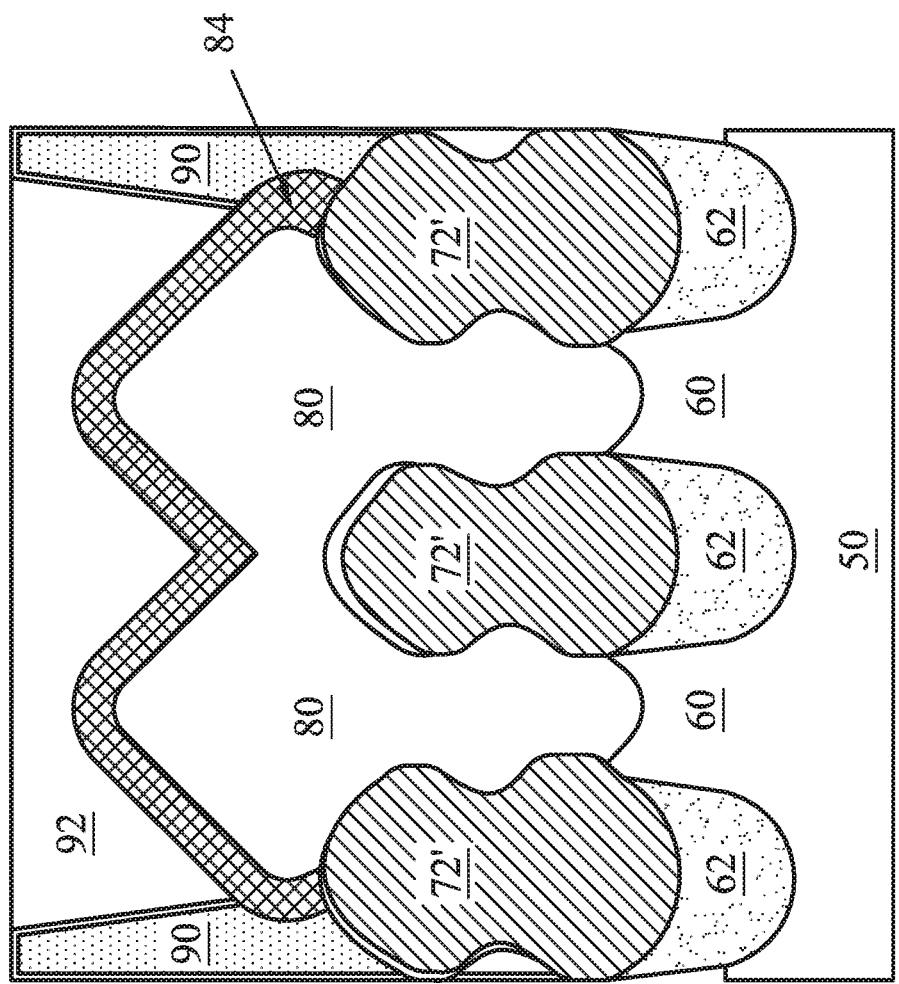

In FIG. 14, a contact 92 is formed through ILD 90. The opening for the contact 92 is formed through the ILD 90. The opening may be formed using acceptable photolithography and etching techniques. In some embodiments, at least a portion of the capping layer 84 is removed during the formation of the opening. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD 90. The remaining liner and conductive material form contacts 92 in the openings. An anneal process may be performed to form a silicide at the interface between the source/drain regions 80 (if present, capping layer 84) and the contact 92. The contact 92 is physically and electrically coupled to the source/drain regions 80 (if present, capping layer 84).

Although not explicitly shown, a person having ordinary skill in the art will readily understand that further processing steps may be performed on the structure in FIG. 14. For example, various inter-metal dielectrics (IMD) and their corresponding metallizations may be formed over ILD 90. Further, contacts to the gate 68 may be formed through overlying dielectric layers.

Further, in some embodiments, a gate-last process (sometimes referred to as replacement gate process) may be used. In those embodiments, the gate 68 and the gate dielectric 66 may be considered dummy structures and will be removed and replaced with an active gate and active gate dielectric during subsequent processing.

Figure 15:
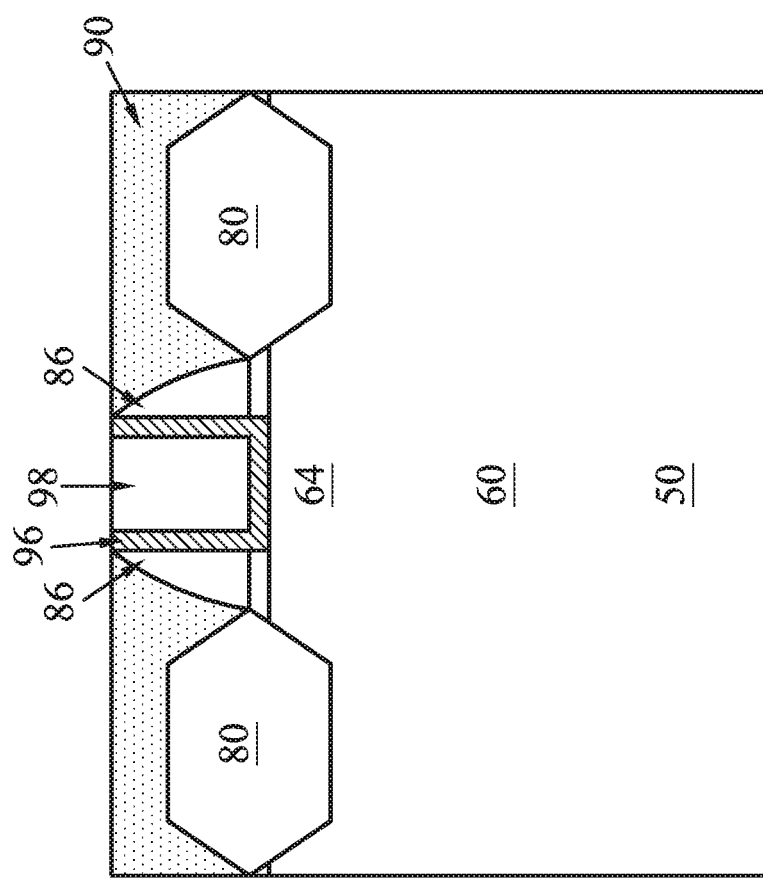
FIGS. 15 and 16 illustrate cross-sectional views of intermediate stages of processing of a gate-last structure in accordance with some embodiments.
Figure 16:
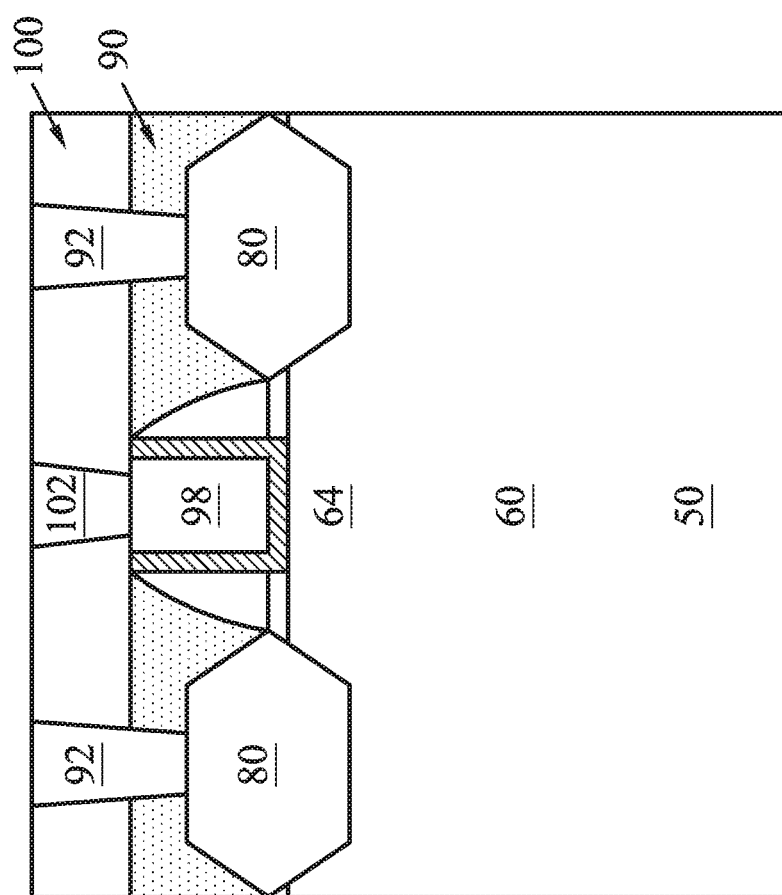

FIGS. 15 and 16 illustrate cross-sectional views of intermediate stages of processing of a gate-last structure in accordance with some embodiments. FIGS. 15 and 16 are cross-sectional views are along the cross-section A-A of FIG. 1.

FIG. 15 illustrates a structure after the processing of FIG. 13 but with additional steps being performed. These additional steps include removing the gate 68 (sometimes referred to as a dummy gate 68 in this embodiment), gate seal spacers 72, and portions of the gate dielectric layer 66 (sometimes referred to as a dummy gate dielectric layer 66 in this embodiment) directly underlying the gate 68. In some embodiments, the gate 68, the gate dielectric 66, and the gate seal spacers 72 are removed in an etching step(s), so that recesses are formed. Each recess exposes a channel region of a respective fin 64. Each channel region is disposed between neighboring pairs of epitaxial source/drain regions 80. During the removal, the dummy gate dielectric layer 66 may be used as an etch stop layer when the dummy gate 68 is etched. The dummy gate dielectric layer 66 and gate seal spacers 72 may then be removed after the removal of the dummy gate 68.

Further, in FIG. 15, gate dielectric layer 96 and gate electrode 98 are formed for replacement gates. The gate dielectric layer 96 is deposited conformally in the recess, such as on the top surfaces and the sidewalls of the fins 64 and on sidewalls of the gate spacers 86, and on a top surface of the ILD 90. In accordance with some embodiments, the gate dielectric layer 96 comprises silicon oxide, silicon nitride, or multilayers thereof. In other embodiments, the gate dielectric layer 96 includes a high-k dielectric material, and in these embodiments, the gate dielectric layers 96 may have a k value greater than about 7.0, and may include a metal oxide or a silicate of Hf, Al, Zr, La, Mg, Ba, Ti, Pb, and combinations thereof. The formation methods of gate dielectric layer 96 may include MBD, ALD, PECVD, and the like.

Next, the gate electrode 98 is deposited over the gate dielectric layer 96, respectively, and fills the remaining portions of the recess. The gate electrode 98 may be made of a metal-containing material such as TiN, TaN, TaC, Co, Ru, Al, combinations thereof, or multi-layers thereof. After the filling of the gate electrode 98, a planarization process, such as a CMP, may be performed to remove the excess portions of gate dielectric layer 96 and the material of gate electrode 98, which excess portions are over the top surface of ILD 90. The resulting remaining portions of material of the gate electrode 98 and the gate dielectric layer 96 thus form a replacement gate of the resulting FinFET.

In FIG. 16, an ILD 100 is deposited over ILD 90. Further illustrated in FIG. 16, contacts 92 are formed through the ILD 100 and the ILD 90 and the contact 102 is formed through the ILD 100. In an embodiment, the ILD 100 is a flowable film formed by a flowable CVD method. In some embodiments, the ILD 100 is formed of a dielectric material such as PSG, BSG, BPSG, USG, or the like, and may be deposited by any suitable method, such as CVD and PECVD. Openings for the contacts 92 are formed through the ILDs 90 and 100. The opening for the contact 102 is formed through the ILD 100. These openings may all be formed simultaneously in a same process, or in separate processes. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD 100. The remaining liner and conductive material form the contacts 92 and 102 in the openings. An anneal process may be performed to form a silicide at the interface between the epitaxial source/drain regions 80 and the contacts 92, respectively. The contacts 92 are physically and electrically coupled to the epitaxial source/drain regions 80 and the contact 102 is physically and electrically coupled to the gate electrode 98.

Embodiments may achieve advantages. For example, the present disclosure is a semiconductor device and method of forming the same to provide a simple and cost-effective process flow to achieve a epitaxial source/drain in a FinFET with less defects (such as dislocations), at least near a channel region of the FinFET, for device enhancement. In addition, this simple and cost-effective process flow may achieve better isolation between adjacent fins by reducing the leakage between adjacent fins and may also reduce the contact resistance to the source/drain region. In particular, embodiments such as those disclosed below include a process flow that utilizes epitaxially grown source/drain regions with some of the isolation material of the isolation region (e.g. shallow trench isolation (STI) region) and some of the sidewall spacer material remaining between the adjacent fins in the source/drain regions. This remaining isolation material and spacer material suppresses the generation of dislocations because it reduces the amount of epitaxial volume between adjacent fins. Further, the remaining isolation material and spacer material can reduce the capacitance between the between the epitaxial source/drain structure. This reduced capacitance can allow for better alternating current (AC) performance for the device. Further, an upper surface of the epitaxial source/drain structure may have a non-planar (e.g. undulating and/or wavy) top surface, which can increase the contact surface area for the overlying contact. This increased contact surface area can reduce the contact resistance to the source/drain region.

An embodiment is a structure including a first fin over a substrate, a second fin over the substrate, the second fin being adjacent the first fin, an isolation region surrounding the first fin and the second fin, a first portion of the isolation region being between the first fin and the second fin, a gate structure along sidewalls and over upper surfaces of the first fin and the second fin, the gate structure defining channel regions in the first fin and the second fin, a gate seal spacer on sidewalls of the gate structure, a first portion of the gate seal spacer being on the first portion of the isolation region between the first fin and the second fin, and a source/drain region on the first fin and the second fin adjacent the gate structure.

Another embodiment is a method including forming fins on a substrate, forming an isolation region surrounding the fins, a first portion of the isolation region being between adjacent fins, forming a gate structure over the fins, forming a gate seal spacer on sidewalls of the gate structure, a first portion of the gate seal spacer being on the first portion of the isolation region between adjacent fins, and forming source/drain regions on opposing sides of the gate structure, at least one of the source/drain regions extending over the first portion of the gate seal spacer.

A further embodiment is a method including forming a first fin and a second fin over a substrate, the second fin being adjacent the first fin, depositing an isolation material surrounding the first fin and the second fin, a first portion of the isolation material being between the first fin and the second fin, upper portions of the first fin and the second fin extending above a top surface of the isolation material, forming a gate structure along sidewalls and over upper surfaces of the first fin and the second fin, the gate structure defining channel regions in the first fin and the second fin, depositing a gate seal spacer on sidewalls of the gate structure, a first portion of the gate seal spacer being on the first portion of the isolation material between the first fin and the second fin, recessing the first fin and the second fin outside of the gate structure to form a first recess in the first fin and a second recess in the second fin, and epitaxially growing a first source/drain region in the first recess of the first fin and the second recess of the second fin, the first portion of the gate seal spacer being interposed between the first portion of the isolation material and the first source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a first fin over a substrate;
    a second fin over the substrate, the second fin being adjacent to the first fin;
    an isolation region surrounding the first fin and the second fin, a first portion of the isolation region being between the first fin and the second fin, the first portion of the isolation region having a concave upper surface;
    a gate structure along sidewalls and over upper surfaces of the first fin and the second fin, the gate structure defining channel regions in the first fin and the second fin;
    a gate seal spacer on sidewalls of the gate structure, a first portion of the gate seal spacer being on the first portion of the isolation region between the first fin and the second fin, the first portion of the gate seal spacer having a convex upper surface distal to the substrate and having a concave lower surface facing the first portion of the isolation region; and
    a source/drain region on the first fin and the second fin.

2. The semiconductor device of claim 1, wherein the source/drain region extends continuously from the first fin to the second fin.

3. The semiconductor device of claim 1, wherein the source/drain region comprises:
    a buffer layer on the first fin and the second fin, the buffer layer having a first dopant concentration of a first dopant;
    a stressor layer on the buffer layer, the stressor layer having a second dopant concentration of the first dopant, the second dopant concentration being larger than the first dopant concentration; and
    a capping layer on the stressor layer, the capping layer having a third dopant concentration of the first dopant, the third dopant concentration being smaller than the second dopant concentration.

4. The semiconductor device of claim 3, wherein the first dopant is germanium.

5. The semiconductor device of claim 1, wherein the source/drain region has a non-planar top surface.

6. The semiconductor device of claim 1, wherein the source/drain region comprises:
    a first portion on the first fin, the first portion of the source/drain region extending vertically from the first fin; and
    a second portion on the first portion, the second portion extending both horizontally and vertically.

7. The semiconductor device of claim 6, wherein the source/drain region comprises:
    a third portion on the second fin, the third portion of the source/drain region extending vertically from the second fin; and
    a fourth portion on the third portion, the fourth portion extending both horizontally and vertically.

8. The semiconductor device of claim 7, wherein the first portion of the gate seal spacer contacts the first portion and the third portion of the source/drain region.

9. The semiconductor device of claim 1, wherein the first portion of the isolation region has a height between about 14 nm and about 20 nm.

10. The semiconductor device of claim 9, wherein the first portion of the gate seal spacer has a height between about 9 nm and about 15 nm.

11. The semiconductor device of claim 1, wherein the first portion of the gate seal spacer has a bottom portion contacting the first portion of the isolation region, a middle portion over the bottom portion, and a top portion over the middle portion, wherein the middle portion is narrower than the top portion and the bottom portion.

12. A semiconductor device comprising:
    fins on a substrate;
    an isolation region between the fins, a first portion of the isolation region being between adjacent fins, the first portion of the isolation region having a concave upper surface;
    a gate structure over the fins;
    a gate seal spacer on sidewalls of the gate structure, a first portion of the gate seal spacer being on the first portion of the isolation region, the first portion of the gate seal spacer comprising:
        a bottom portion contacting the first portion of the isolation region, the bottom portion having a first width and a concave lower surface contacting the first portion of the isolation region;
        a middle portion over the bottom portion, the middle portion having a second width smaller than the first width; and
        a top portion over the middle portion, the top portion having a third width larger than the second width; and
    source/drain regions on opposing sides of the gate structure.

13. The semiconductor device of claim 12, wherein the source/drain regions extend continuously from a first one of the fins to an adjacent second one of the fins, wherein the first portion of the gate seal spacer is disposed between the source/drain regions and the isolation region.

14. The semiconductor device of claim 12, wherein the top portion of the first portion of the gate seal spacer has a convex upper surface distal from the substrate.

15. The semiconductor device of claim 12, wherein upper surfaces of the source/drain regions extends further from the substrate than the concave upper surface of the first portion of the isolation region.

16. The semiconductor device of claim 12, wherein the source/drain regions comprise:
- a first sublayer on the fins, the first sublayer having a first dopant concentration of germanium;
- a second sublayer on the first sublayer, the second sublayer having a second dopant concentration of germanium larger than the first dopant concentration; and
- a third sublayer on the second sublayer, the third sublayer having a third dopant concentration of germanium smaller than the second dopant concentration, wherein the first dopant concentration, the second dopant concentration, and the third dopant concentration are larger than zero.

17. The semiconductor device of claim 16, wherein the second dopant concentration is larger than about 40%.

18. A semiconductor device comprising:
- a first fin and a second fin protruding above a substrate, the second fin being adjacent to the first fin;
- an isolation material between the first fin and the second fin, the isolation material having a concave upper surface, the first fin and the second fin extending above the concave upper surface of the isolation material;
- a gate structure over the first fin and the second fin;
- a gate seal spacer on sidewalls of the gate structure, a first portion of the gate seal spacer being on the isolation material between the first fin and the second fin, wherein a center of an upper surface of the first portion of the gate seal spacer extends further from the substrate than opposing edges of the upper surface of the first portion of the gate seal spacer, wherein a center of a lower surface of the first portion of the gate seal spacer extends closer to the substrate than opposing edges of the lower surface of the first portion of the gate seal spacer; and
- a source/drain region on the first fin and the second fin, the source/drain region extending continuously from the first fin to the second fin, the first portion of the gate seal spacer being interposed between the isolation material and the source/drain region.

19. The semiconductor device of claim 18, wherein the source/drain region comprises:
- a first portion extending from upper surfaces of the first fin and the second fin to the upper surface of the first portion of the gate seal spacer; and
- a second portion on the first portion, the second portion extending over the first portion of the gate seal spacer.

20. The semiconductor device of claim 18, wherein the source/drain region comprises a dopant, wherein a concentration of the dopant increases from a bottom portion of the source/drain region to a middle portion of the source/drain region, wherein the concentration of the dopant decreases from the middle portion of the source/drain region to a top portion of the source/drain region.

* * * * *